US011953573B2

(12) United States Patent
Narayanan et al.

(10) Patent No.: US 11,953,573 B2
(45) Date of Patent: Apr. 9, 2024

(54) SYSTEMS AND METHODS FOR IMAGE RECONSTRUCTION IN MAGNETIC RESONANCE IMAGING

(71) Applicant: PROMAXO, INC., Oakland, CA (US)

(72) Inventors: Ram Narayanan, San Jose, CA (US); Aleksandar Nacev, San Francisco, CA (US); Pulkit Malik, Dublin, CA (US); Muller Francis De Matos Gomes, Hayward, CA (US)

(73) Assignee: Promaxo, Inc., Oakland, CA (US)

( * ) Notice: Subject to any disclaimer, the term of this patent is extended or adjusted under 35 U.S.C. 154(b) by 0 days.

(21) Appl. No.: 17/596,610

(22) PCT Filed: Jun. 25, 2020

(86) PCT No.: PCT/US2020/039667
§ 371 (c)(1),
(2) Date: Dec. 14, 2021

(87) PCT Pub. No.: WO2020/264194
PCT Pub. Date: Dec. 30, 2020

(65) Prior Publication Data
US 2022/0342020 A1    Oct. 27, 2022

Related U.S. Application Data

(60) Provisional application No. 62/866,533, filed on Jun. 25, 2019.

(51) Int. Cl.
*G01R 33/56* (2006.01)
*G01R 33/385* (2006.01)

(52) U.S. Cl.
CPC ....... *G01R 33/5608* (2013.01); *G01R 33/385* (2013.01)

(58) Field of Classification Search
CPC .......................... G01R 33/385; G01R 33/5608
See application file for complete search history.

(56) References Cited

U.S. PATENT DOCUMENTS

D895,803 S    9/2020   Nacev et al.
D942,012 S    1/2022   Nacev et al.
(Continued)

FOREIGN PATENT DOCUMENTS

WO    2009037709 A2    3/2009
WO    WO-2020168233 A1    8/2020
(Continued)

OTHER PUBLICATIONS

International Search Report and Written Opinion for International PCT Application No. PCT/US2020/039667, dated Oct. 1, 2020.
(Continued)

*Primary Examiner* — Gregory H Curran
(74) *Attorney, Agent, or Firm* — Wilson Sonsini Goodrich & Rosati

(57) ABSTRACT

Some embodiments of the present disclosure disclose systems and methods for robust magnetic resonance image reconstruction that can model for all or nearly all components in the magnetic resonance imaging system, that possess compressibility features to speed up reconstructions, and that can be optimized such that the reconstruction can be performed within a short period of time.

44 Claims, 7 Drawing Sheets

(56) References Cited

U.S. PATENT DOCUMENTS

| | | |
|---|---|---|
| 11,506,737 B2 | 11/2022 | Gomes |
| D980,981 S | 3/2023 | Nacev et al. |
| 11,609,291 B2 | 3/2023 | Nacev et al. |
| 11,656,303 B2 | 5/2023 | Nacev et al. |
| 2009/0285463 A1 | 11/2009 | Otazo et al. |
| 2011/0044524 A1 | 2/2011 | Wang et al. |
| 2012/0286783 A1 | 11/2012 | Constable et al. |
| 2015/0204957 A1* | 7/2015 | Smith ............ G01R 33/56536 324/309 |
| 2016/0291112 A1 | 10/2016 | Constable et al. |
| 2016/0341808 A1 | 11/2016 | Zhang et al. |
| 2017/0069082 A1* | 3/2017 | Mailhe ............ G01R 33/5608 |
| 2018/0038932 A1 | 2/2018 | Arunachalam |
| 2018/0188342 A1* | 7/2018 | Heberlein ......... G01R 33/4824 |
| 2022/0113361 A1 | 4/2022 | Nacev et al. |
| 2022/0146613 A1 | 5/2022 | Gomes |
| 2023/0109705 A1 | 4/2023 | De Matos Gomes |

FOREIGN PATENT DOCUMENTS

| | | |
|---|---|---|
| WO | WO-2020172672 A1 | 8/2020 |
| WO | WO-2020172673 A1 | 8/2020 |
| WO | WO-2020198395 A1 | 10/2020 |
| WO | WO-2020198396 A1 | 10/2020 |
| WO | 2020264194 A1 | 12/2020 |

OTHER PUBLICATIONS

Walsh et al. Adaptive Reconstruction of Phased Array MR Imagery. Magnetic Resonance in Medicine 43:682-690 (2000).

Cooley et al. Two-Dimensional Imaging in a Lightweight Portable MRI Scanner without Gradient Coils. Magnetic Resonance in Medicine 73:872-883 (2015).

EP20831322.1 Extended European Search Report dated Dec. 4, 2023.

Siddiqui et al. FPGA implementation of real-time SENSE reconstruction using pre-scan and Emaps sensitivities. Magnetic Resonance Imaging, vol. 44, pp. 82-91. Year: 2017.

Kyriakos et al. Generalized Encoding Through the Use of Selective Excitation in Accelerated Parallel MRI. NRM in Biomedicine 2006; 19: 379-392.

Liu et al. The Ill-Posed Problem and Regularization in Parallel Magnetic Resonance Imaging. 3rd International Conference on Bioinformatics and Biomedical Engineering, 2009.

* cited by examiner

SYSTEMS AND METHODS FOR IMAGE RECONSTRUCTION IN MAGNETIC RESONANCE IMAGING

CROSS-REFERENCE TO RELATED APPLICATIONS

The present application is a U.S. National Stage Entry under 35 U.S.C. § 371 of International PCT Application No. PCT/US2020/039667, entitled "SYSTEMS AND METHODS FOR IMAGE RECONSTRUCTION IN MAGNETIC RESONANCE IMAGING," filed Jun. 25, 2020, which claims the benefit of priority under 35 U.S.C. § 119(e) to U.S. Provisional Application No. 62/866,533, entitled "SYSTEMS AND METHODS FOR IMAGE RECONSTRUCTION IN MAGNETIC RESONANCE IMAGING", filed on Jun. 25, 2019, both of which are incorporated by reference herein in their respective entireties.

TECHNICAL FIELD

The present disclosure relates generally to systems and methods for effective reconstruction of magnetic resonance images from magnetic resonance imaging signals, and more specifically, to systems and methods that allow for generalization to incorporate all or nearly all aspects of the magnetic resonance imaging system and compressibility and optimization to expedite the image reconstruction process.

BACKGROUND

In magnetic resonance imaging (MRI), a signal is measured from objects of interest or samples through the application of a pulse sequence. In a traditional MRI system, measured signals are acquired over a rectilinear grid of frequencies (also referred to as a cartesian scan), and the image can be reconstructed by a 2D inverse Fast Fourier Transform (FFT). Another common method is to acquire samples on a polar grid, and use the 2D inverse FFT after interpolating this data to a rectangular grid.

Figure 1:
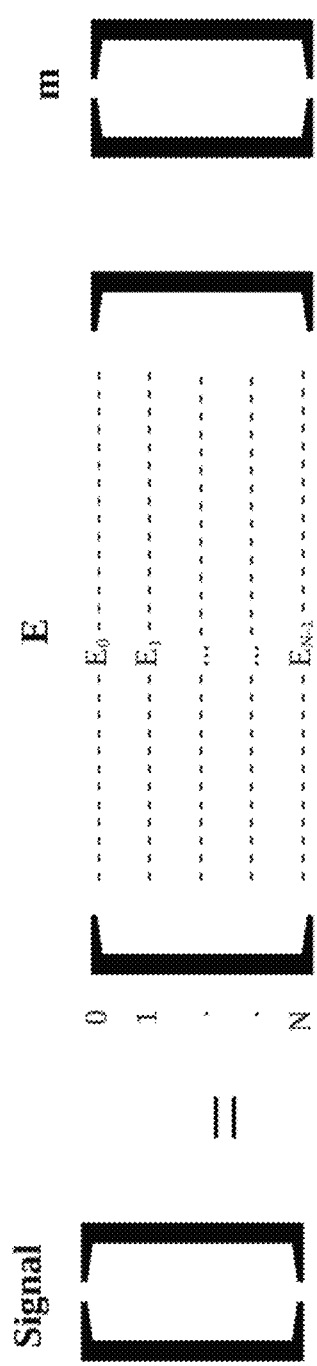
FIG. 1 is an example schematic illustration of a linear system model for modeling image reconstruction in magnetic resonance imaging (MRI) systems, according to some embodiments of the present disclosure.

It is to be understood that the figures are not necessarily drawn to scale, nor are the objects in the figures necessarily drawn to scale in relationship to one another. The figures are depictions that are intended to bring clarity and understanding to various embodiments of apparatuses, systems, and methods disclosed herein. Wherever possible, the same reference numbers will be used throughout the drawings to refer to the same or like parts. Moreover, it should be appreciated that the drawings are not intended to limit the scope of the present teachings in any way.

BRIEF SUMMARY OF SOME OF THE EMBODIMENTS

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In some embodiments of the present disclosure, methods and systems for effective reconstruction of magnetic resonance images from magnetic resonance imaging signals are disclosed. In some embodiments, a total magnetic field including magnetic field gradients and one or more RF pulse sequences may be applied using a transmit coil and a radio frequency (RF) source respectively, to measure one or more states of a sample. Further, MRI measurement data acquired by the receive coils during an acquisition window may be received at a processor from one or more receive coils, the MRI measurement data including magnetic resonance signal data emitted by the sample. Further, a subset of the MRI measurement data can be linearly combined, via a processor, to generate a first encoding matrix, the first encoding matrix being a sub-matrix of a second encoding matrix configured to (i) be generated by linearly combining all the MRI measurement data, and (ii) represent the one or more states of the sample, the transmit coil and the receive coils. In addition, a characteristic of the MRI measurement data can be determined, by the processor, based on a computation of the first encoding matrix.

DETAILED DESCRIPTION

The following description of various embodiments is exemplary and explanatory only and is not to be construed as limiting or restrictive in any way. Other embodiments, features, objects, and advantages of the present teachings will be apparent from the description and accompanying drawings, and from the claims. Unless defined otherwise, all technical and scientific terms used herein have the same meaning as commonly understood by one of ordinary skill in the art to which this invention belongs.

All publications mentioned herein are incorporated herein by reference in their entirety for the purpose of describing and disclosing devices, compositions, formulations and methodologies which are described in the publication and which might be used in connection with the present disclosure.

As used herein, the terms "comprise", "comprises", "comprising", "contain", "contains", "containing", "have", "having", "include", "includes", and "including" and their variants are not intended to be limiting, are inclusive or open-ended and do not exclude additional, unrecited additives, components, integers, elements or method steps. For example, a process, method, system, composition, kit, or apparatus that comprises a list of features is not necessarily limited only to those features but may include other features not expressly listed or inherent to such process, method, system, composition, kit, or apparatus.

In some embodiments, the term "signal components" can refer to parts of a magnetic resonance imaging (MRI) system responsible for generating a signal. This can comprise at least, but not limited to, the pulse sequence construction, transmit coils and receive coils, etc. For each state of the pulse sequence, all or nearly all the receive coils may acquire data over an acquisition window. In some embodiments, the term "acquisition window" may refer to time in the magnetic resonance (MR) pulse sequence during which the MR signal is recorded.

In some embodiments, the term "pulse sequence" may refer to a set of radio frequency (RF) and gradient pulses, repeated a plurality of times during an acquisition to encode spatial and amplitude information that describes the object of interest (e.g., sample). In some cases, these repetitions can vary in the degree of gradients, or shapes of the individual pulses applied, and can be ultimately determined by the quality of the image desired. In MRI systems, a z-axis gradient is applied to select a slice to excite, x-axis and y-axis gradients to spatially localize, and RF pulses to perform the excitation.

In some embodiments, the term "transmit coils" may refer to coils of conductive wire in an MRI system that can generate an oscillating or rotating magnetic field that is perpendicular to a main static magnetic field ("$B_0$") of the MRI system. In some embodiments, the term "receive coils" may refer to coils of conductive wire in an MRI system that detect the magnetic resonance (MR) signal. In some aspects, the receive coils can differ in their spatial sensitivity (i.e., amplitudes) as well as in phase across each other. In addition, in some aspects, transmit coils can also differ in their spatial sensitivity (i.e., amplitudes) as well as in phase across each other.

In some embodiments, the term "image acquisition timing" may refer to the time for carrying out an MR imaging procedure comprising only the data acquisition time. In some cases, the total image acquisition time can be equal to the product of the repetition time, the number of signals averaged, and the number of different signals (encoded for position) to be acquired for use in image reconstruction. The additional image reconstruction time will also be important to determine how quickly the image can be viewed. In comparing sequential plane imaging and volume imaging techniques, the equivalent image acquisition time per slice as well as the actual image acquisition time may be considered.

In some embodiments, the term "frequency offset" can refer to the difference between given signal frequency and a reference frequency. In some aspects, the frequency offset can be the center frequency for slice excitation.

In some embodiments, the object of interest that is being imaged by a MRI system may emit a signal that can be measured by the MRI system and contains amplitudes of the frequencies measured. In some cases, measured signals can be acquired over a rectilinear grid of frequencies or a cartesian scan, and the image can be reconstructed by a 2D inverse Fourier transform (FFT). In some cases, samples may be acquired on a polar grid, and use the 2D nonuniform FFT after interpolating this data to a rectangular grid. In such approaches, the problem can be defined as $$s(t) = \int m(r) e^{-j2\pi k(t)r} dr$$

where s(t) is the measured signal, k represents the k-space trajectory, and r corresponds to spatial positions sampled, and the problem can be formulated as the recovery of the image m, by observing a number of samples in s.

Such approaches, however, may have various limitations including requiring the signal to be fully sampled, or re-gridded in cases of non-cartesian grids or under-sampling before performing a non-uniform FFT, that is to have sufficient bandwidth, and appropriate sample spacing to fully capture the object of interest without limiting the field of view or aliasing. Non-cartesian acquisitions may also require a frequency sampling density correction to minimize overrepresentation of k-space regions that can produce artifacts. Additionally, these methods may make several assumptions that may simplify or not fully capture the MRI system, including the gradients being linear, the main field of the magnet $B_0$ being uniform, the receive coils having similar spatial sensitivity profiles, etc. Further, the methods may model the signals in pulse sequences mathematically without practical considerations of rise and fall times, the true shape of the gradient profile, etc. As a result, image reconstructions for multi-parametric MRI may not adequately model these factors. In addition, image reconstructions for multi-parametric MRI may take hours for high quality images.

While a number of methods have been proposed to overcome these limitations (e.g. non-uniform fast Fourier transforms, sensitivity encoding, generalized auto-calibrating partial-parallel acquisition, compressed sensing approaches, etc.), the above stated limitations can still exist and there is a need for a robust image reconstruction that can model for all or nearly all components in the system, that possess compressibility features to speed up reconstructions, and that can be optimized such that reconstruction is feasible in minutes, not hours. The present disclosure discloses embodiments configured for magnetic resonance image reconstruction that address the challenges and limitations discussed above to provide more robust systems and methods for image reconstruction.

Some embodiments of the present disclosure disclose image reconstruction approaches or methods that can be generalized, compressed and/or optimized. The methods can be generalized in that the image reconstruction approach can model for all or nearly all components in the system including at least the magnetic field gradients, the main magnetic field $B_0$, the transmit and receive coil phase and amplitude sensitivities, the shape of the gradient profile, the readout-gradient and phase during measurement which may include phases induced by the x and y gradient in the presence of a permanent main field. Further, the approaches or methods can have compressibility features to speed up reconstructions, for example, can allow for image recovery without dense sampling in ways that can exploit the features of the objects being imaged. In some embodiments, compressibility can be achieved via various mechanisms—random under-sampling, parallel reconstruction using multiple spatially sensitive coils, sparsity constraints using wavelet compression, L-1 and nuclear norm objective functions, multiple slice excitations within a single repetition time, and wideband chirp pulse excitations to excite large regions. In addition, the image reconstruction approaches or methods may be optimized such that reconstruction is feasible in minutes or within an hour.

FIG. 1 shows an example schematic illustration of a linear system model for modeling image reconstruction in magnetic resonance imaging (MRI) systems, according to some embodiments of the present disclosure. In general, a model for reconstructing an image from provided parameter measurements can be broadly described as a linear. As illustrated in FIG. 1, the linear system model 100 includes a signal vector signal (s) 102, which contains all or nearly all measurements made on the system (i.e., on the object of interest or sample) from multiple receive coils. The linear system model 100 also includes a matrix E 104 that serves as the encoding matrix that contains all or nearly all generalizations of the given system. In some cases, matrix E can be comprised of block matrices $E_0, E_1, \ldots, E_{N-1}$, where each block corresponds to a single line of the pulse sequence separated by repetition time (RT) for a total of $N=n_s$, where $n_s$ is number of pulse sequence lines. Each block matrix may further be comprised of individual rows which correspond to a single time point for that line and one receive coil in the pulse sequence from the recorded signal window. The total number of rows in the matrix E can be expressed as the product of the number of states (i.e. pulse sequence lines) $n_{states}$, number of receive coils used $n_{coils}$ and the number of points in the acquisition window $n_t$ (i.e., $n_{states} \times n_{coils} \times n_t$). The linear system model 100 further includes the image vector m 106 which is to be solved by making observations on signal s 102, where the matrix E 104 describes the state of the system. That is, the state of the MRI system 100 including system features such as magnetic field gradients, receive and transmit coils, main magnetic field $B_0$ configurations for the pulse sequence, and/or the like are encoded in the matrix E 104.

In some embodiments, a component in the E matrix 104 $E_{ij}$ may be modeled as follows:

$$E_{ij} = C_{H(i_s)}^{+C_{i_c}^-} e^{j\gamma(p_A + p_B + p_C + p_{B_0})},$$

where $p_A$ is the phase accumulated when a magnetic gradient is present during the signal readout, $p_B$ is the phase accumulated when the gradient pulse prior to the readout induces a phase shift, $p_C$ is the phase from the transmit and receive coils, and finally $p_{B_0}$ is the phase from the $B_0$ field that is static (e.g., always present or on during the measurement). In some embodiments, parameter H may represent the transmit coil selection for the measurements and is a function of the state, e.g., for a given state (e.g., state=10), the transmit coil selected by $H(i_{state})$ is selected for transmission.

The phase terms can be calculated as $$p_A = \langle A(i_s, 0, i_t) Bgx(j) + A(i_s, 1, i_t) Bgy(j), B_0^N(j) \rangle,$$

$$p_B = \langle B(i_s, 0) Bgx(j) + B(i_s, 1) Bgy(j), B_0^N(j) \rangle,$$

$$p_C = \angle C^+(j) + \angle C^-, \text{ and}$$

$$p_{B_0} = (B_0(j) - F(i_s)) t_{i_t}.$$

In these definitions, the main field $B_0$ and the gradient fields may be expressed in units of radians (with gamma pre-multiplied). These expressions allow for calculating the phases from the gradient profile matrix (A), and the phase matrix (B), while incorporating the non-uniform field $B_0$, and the center frequency offset matrix F. In some embodiments, the above encoding matrix E can have a specific structure. In some cases, the encoding matrix E can be completely determined by the transmit and receive coil maps, A and B matrices, and may not be required to be fully stored in memory for generating or reconstructing magnetic resonance images. In some embodiments, the encoding matrix E can also be exceptionally large, e.g., in the order of hundreds of thousands of rows and a similar number of columns. However, in some cases, building individual elements in the matrix as needed without having to store the entire matrix allows for advantageously exploiting the above structure in the encoding matrix E.

In some embodiments, the measured signal may contain a small global shift. The reconstructed image may contain a bright dot artifact at the center. To remove this, a column of ones may be appended to the encoding matrix, with the image being reconstructed along with the shift coefficient estimated.

The index i corresponds to a single acquisition for a unique pulse sequence line, coil (e.g., receive or transmit) and time point. The indices $i_s$ and $i_c$ are extracted from i, and defined as follows: for i in $[0, n_{states} \times n_{coils} \times n_t]$, is refers to a pulse sequence line, $i_c$ refers to the signal recorded for a specific coil and $i_t$ corresponds to the time when the signal was recorded within the signal window. Further, j corresponds to the $j^{th}$ voxel within the image vector m.

The parameters $B_{gx}$, $B_{gy}$ and $B_{gz}$ may represent the field measured from x, y and z gradients, respectively. When subscripted by x, y and z, parameter B represents the field generated by the gradient in that direction. For example, $B_{gx}$ corresponds to the field produced by the x gradient which is a gradient applied predominantly along the x direction, and is a 3D vector field, where each $B_{gx}$ location on the image contains x, y and z components. Matrix $B_{gx}$ can thus be expressed as a $n_{image} \times 3$ matrix, where $n_{image} = x_n \times y_n \times z_n$ and where $x_n$, $y_n$ and $z_n$ are the number of voxels reconstructed along each dimension. As another example, $B_{gy}$ corresponds to the field produced by the y gradient which is a gradient applied predominantly along the y direction, and is a 3D vector field, where each $B_{gy}$ location on the image contains x, y and z components. Matrix $B_{gy}$ can thus be expressed as a $n_{image} \times 3$ matrix. As yet another example, Matrix $B_{gx}$ can thus be expressed as a $n_{image} \times 3$ matrix, where the number of voxels in the reconstructed image $n_{image} = x_n \times y_n \times z_n$ and where $x_n$, $y_n$ and $z_n$ are the number of voxels reconstructed along each dimension. As another example, $B_{gz}$ corresponds to the field produced by the z gradient which is a gradient applied predominantly along the z direction, and is a 3D vector field, where each $B_{gz}$ location on the image contains x, y and z components. Matrix $B_{gz}$ can thus be expressed as a $n_{image} \times 3$ matrix.

In some embodiments, the dimensionality of the linear system model 100 in FIG. 1 may be defined based on measured parameters, which can be identified or defined as follows. In some aspects, repetition of the pulse sequence can be referred to as a single state in the system, where the total number of such states is defined as $n_s$ (or $n_{states}$). For each state, a signal array is measured of length $n_t$, representing the length of a single acquisition. In some embodiments, the dimensions of the image being reconstructed can be expressed as $(x_n, y_n, z_n)$, where $x_n$, $y_n$ and $z_n$ are the number of voxels reconstructed along each dimension. The image vector m 106 illustrated in FIG. 1 may be expressed as the linear arrangement (vectorization) of all voxels such that the total length is the product of the dimensions, i.e. $n_{image} = x_n \times y_n \times z_n$.

In some embodiments, the MRI system may be provided with multiple coils (receive coils) each making measurements simultaneously (e.g., and independently). The number of such receive coils may be represented by the parameter $n_{coils}$.

In some embodiments, the matrix A (e.g., in the expression for $p_A$) is provided with dimensions represented by $n_s \times 2 \times n_m$, where $n_m$ the number of points in a readout window (during acquisition). For each pulse sequence state in the first dimension, and for each gradient direction in the second dimension, matrix A can contain the gradient profile stored along the third dimension over the duration of the acquisition (e.g., along readout), thus representing the normalized shape of the readout gradient applied. In a simplified set up, matrix A may have identical profiles for all states of the pulse sequence, i.e. the same gradient can be applied during readout. For example, a rectangular pulse during readout such that all recorded signal during readout are impacted by this gradient (along this gradient direction).

In some embodiments, the matrix B (e.g., in the expression for $p_B$) is provided with dimensions represented by $n_s \times 2$. For each pulse sequence state in the first dimension, matrix B may contain the phase stored for each gradient. These are the gradient pulses applied prior to acquiring the signal such that the spins are endowed with the phase corresponding to this gradient pulse during signal acquisition. As a non-limiting example illustration, in a simple single-phase imaging experiment acquiring a 30×30 phase encodes, there are 900 states in the pulse sequence or 30 varying gradient strengths along one direction and 30 along the other. Each row of the B matrix can contain phase accumulated due to each gradient for the pulse sequence line to which it corresponds.

In some embodiments, the matrix $C^-$ (e.g., in the expression for $p_C$), which may be referred to as a receive coil sensitivity matrix, may be provided with dimensions represented by $n_{image} \times 2 \times n_{coils}$. For each voxel in the image referenced by the first dimension, the second dimension corresponds to the amplitude and phase for that voxel, and for the index of each receive coil (for multiple coils) that is specified in the third dimension. As such, matrix $C^-$ stores the two-component (amplitude and phase) sensitivity map for each receive coil over the entire image. For each voxel location, the amplitude and phase sensitivities are stored for each receive coil in the $C^-$ matrix. Matrix $C^+$ (also referred to as a transmit coil matrix) may be constructed in the same way as C but for transmit coils. In some embodiments, parameter $t_w$ represents the time window over which the echo is measured, centered about the echo time.

In defining dimensionality of the linear system of FIG. 1, the calculation for measured signal s can be provided, which contains signal recorded from all states and all coils:

$$s = (s^{0,0})^T, (s^{0,1})^T, (s^{0,2})^T, (s^{0,3})^T, \ldots, (s^{ns-1,0})^T, (s^{ns-1,1})^T, (s^{ns-1,2})^T, (s^{ns-1,3})^T)$$

where $s^{i,j}$ corresponds to the measured acquisition window for state i and coil j, respectively. That is, as each state is a single pulse sequence line, coil j refers to the $j^{th}$ coil that is recording signal when the $i^{th}$ pulse sequence line is played out. The signal thus contains all possible measurements of the system that includes all coils, all states and the entire acquisition window. That is, each $s^{i,j}$ is a vector (recorded points along readout), and they are all stacked together to form a much larger vector s, which contains all states, all coils and all points—i.e., all recorded signal by the system. Referring to FIG. 1, the length of the vectors and image vector m are, respectively, length $(s) = n_s \times n_{coils} \times n_t$ and length $(m) = n_{image}$. In some embodiments, vector m is equal to the number of voxels. That is, it may be a linear arrangement of all voxel intensities that may be determined by reconstruction or image size selected by the user to reconstruct the image on to.

Therefore, taking these two lengths into account, the dimensions of the encoding matrix E, i.e., the number of rows and the number of columns of the encoding matrix are represented by $n_s \times n_{coils} \times n_t$, $n_{image}$.

In some embodiments, the data from the receive coils may have already collapsed prior to reconstruction. In such situations of prior collapsing, the formulation above can be generalized to the case of just one coil that contains the phase adjusted and averaged measurements from all coils. In other instances, individual images may be reconstructed using one coil at a time, and subsequently combined in the image domain. Some methods of combining in the image domain are discussed in the non-patent literature titled "Adaptive reconstruction of phased array MR imagery," by D. O. Walsh, A. F. Gmitro and M. W. Marcellin, Magnetic Resonance in Medicine (May 1, 2000), the entirety of which is incorporated by reference herein.

In some embodiments, methods for providing enhanced magnetic resonance image reconstruction include encoding matrix construction with constraints. The methods provide a generalized framework for image reconstruction that advantageously accomplishes a universal encoding matrix set up that successfully accounts for non-linear gradients, a non-uniform $B_0$ field (i.e., non-uniform main magnetic field), global signal shifts during image acquisition, varying sensitivity amplitude and phases for transmit coils and receive coils, and excitation frequency and bandwidth of the received signal that supports all or nearly all pulse sequences. Additional constraints for compressibility in the wavelet domain, and smoothness of the reconstructed image can also be optimized simultaneously.

Further, the method advantageously solve for curvilinear 3D image sections excited by the main magnetic field $B_0$ using simultaneous iterative reconstruction, conjugate gradients and compressed sensing solvers set up to use the universal encoding matrix. In addition, the provided solvers can be advantageously optimized on a graphics processing unit (GPU) without the need for building the universal encoding matrix all at once, allowing for the possibility to solve very large linear systems such as those with greater than, for example, 500,000 rows and columns each. This can be done by exploiting the structure of the encoding matrix by storing its underlying matrices (e.g., A, B, $C^+$, $C^-$, etc.) and building them dynamically. Moreover, the methods further advantageously provide an interpolation method (e.g., volume interpolation method) to combine curvilinear 3D image sections that overlap to construct a complete rectilinear 3D volume.

Figure 2:
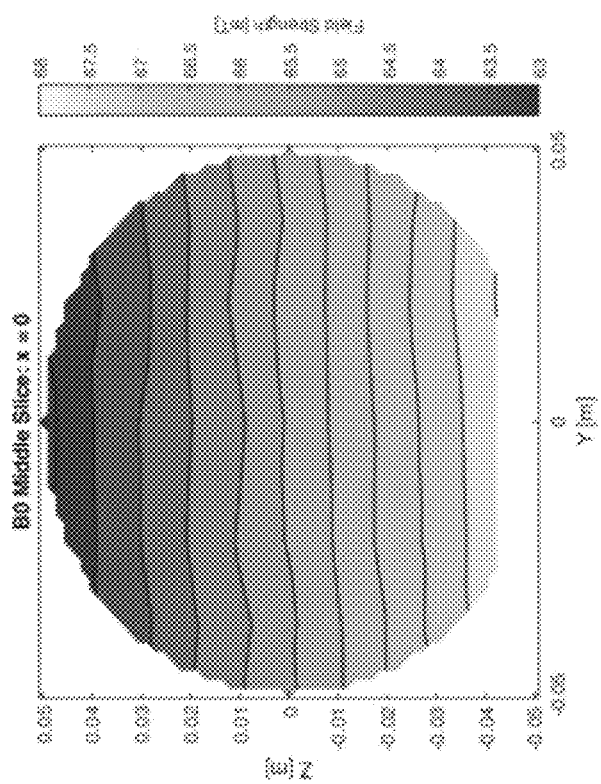
FIG. 2 is an example illustration of a slice profile a main magnetic field in a MRI system, according to some embodiments of the present disclosure.
Figure 3D:
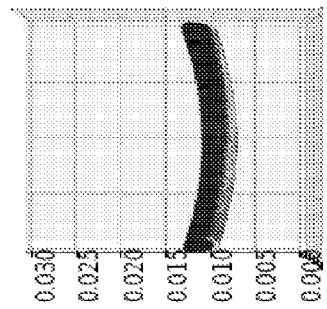
FIGS. 3A-3D are example illustrations of an extracted surface corresponding to a slice excitation, according to some embodiments of the present disclosure.
Figure 3C:
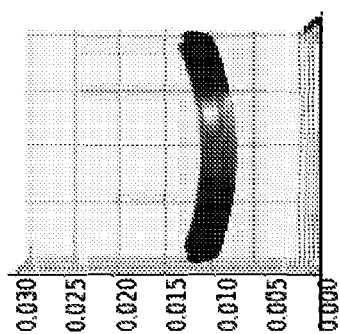
Figure 3B:
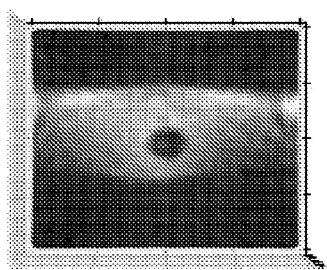
Figure 3A:
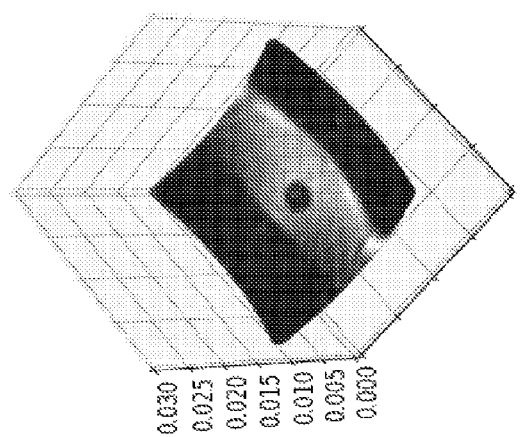

Referring now to FIG. 2, the main magnetic field $B_0$ can generally be designed to optimize linearity and homogeneity within a slice. However, for a slice excitation frequency, the iso-contour over the main field where all points experience approximately the same degree of excitation can be in the form of a curvilinear surface as illustrated in FIGS. 3A-3D. In some embodiments, the voxel intensities at all points in the curvilinear section can be solved for. The curvilinear surface can be extracted by a linear regression fit on the data, assuming elliptical geometry. In some cases, the surface may be curvilinear as a result of the shape of the main $B_0$ magnetic field. That is, its isocontours can create this shape. As such, when a frequency is excited, curved region whose resonant frequency matches this excitation frequency can be excited as well, and the image may be reconstructed in this region. For multiple slices, the reconstruction has a similar curvilinear geometry, and can appear as a surface with some thickness, referred to as a slab. Many such slabs may be reconstructed over the entire field of view, and interpolated to build a 3D rectilinear volume.

In some embodiments, one can apply the following example workflow to identify specific slabs to reconstruct. First, a slab's field of view and resolution defined in x, y and z parameters are selected from which to build a mesh grid in x and y parameters. The field of view in z parameter can depend on the bandwidths of the transmit coils and receive coils.

Second, the surface that corresponds to the center of the slab is determined from the slice excitation frequency using, for example, a regression model. For example, to build a regression model, the features provided to fit a regression model are the x, y parameters and frequency ($\gamma B_0$) for a known value of z. In this case, a measured main field data is represented by $B_0$ (x, y, z) (where the field is expressed at all locations of x, y and z that are measured), and frequency is represented by $\gamma B_0$. From this, the model's coefficients can be estimated. Using the model's coefficients and the mesh grid over x and y, the z locations that correspond to these x and y grid points can be determined. This constitutes the desired center surface of the slab.

Next, using the determined slab center surface, additional surfaces parallel to the center surface can be built to span the field of view in z. Upon build completion, a grid $G^{f_l}(x, y, z)$ for the entire slab is provided, where $f_l$ is the $l^{th}$ frequency excited.

Figure 4B:
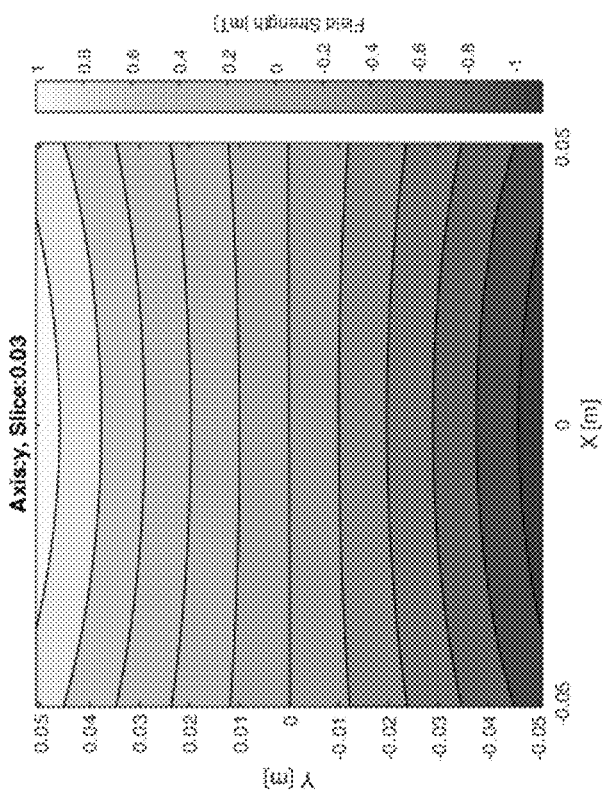
FIGS. 4A-4B show example illustrations of non-linearly varying spatial magnetic field gradients in x and y directions, respectively, according to some embodiments of the present disclosure.
Figure 4A:
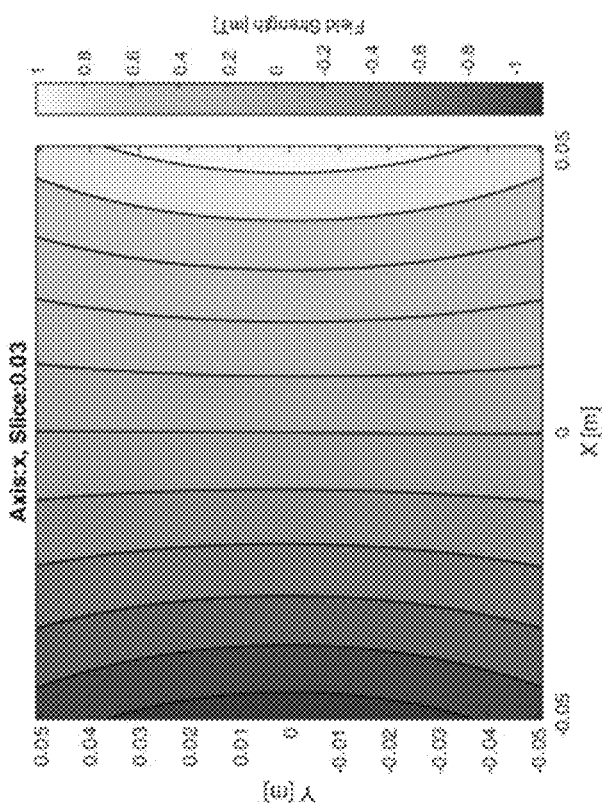

From there, the slab can be reconstructed at each of the grid points in $G^{f_l}$. As a result, the main field $B_0$ can be extracted at every point along the grid, referenced by $B_0^B$. Moreover, the gradients at these locations can also be extracted. According to various embodiments, these gradients are spatially non-linear as shown below in FIG. 4A for the x-axis and FIG. 4B for the y-axis, whereby the field from these gradients in x and y can be referred to as $B_x^G$ and $B_y^G$ respectively at the grid locations. Finally, the spatial sensitivities of the transmit coils and receive coil maps can also be similarly determined.

Accordingly, a method is provided for identifying a first surface to reconstruct. The first surface can be a slab. The first surface can have a curvilinear geometry. The method can comprise, selecting a field of view of the first surface and selecting a resolution in x, y and z. The method can further comprise building a mesh grid in x and y. The method can further comprise, for a specific slice excitation frequency, determining a second surface that corresponds to the center of the first surface. The determining can comprise building a regression model. The method can further comprise building additional second surfaces parallel to the center surface. This building can span the field of view in z to provide a grid $G^{f_l}(x, y, z)$ for the entire first surface, where $f_l$ is the $l^{th}$ frequency excited.

Reconstruction

In some embodiments, after the linear system is set up as discussed above, the image m (represented as a curvilinear slab described above) can then be solved at a series of slice excitation locations. Each such image reconstructed is denoted as $m_{sl}$, where sl corresponds to the index of the slice excited. After solving for multiple such linear systems for these slab excitations to generate a set of reconstructions $\{m_{s1}, m_{s2}, \ldots, m_{sn}\}$, a final volume V can be constructed, as detailed below.

Referring to FIG. 1, with the matrix E solved for, reconstruction begins after the entire signal vector s is acquired, or as signal data is gathered depending on the method used. Multiple reconstruction methods can be used (individually or in combination) to achieve the reconstruction including, for example, simultaneous iterative reconstruction technique (SIRT), and conjugate gradient methods such as, for example, the method of conjugate gradients least squares (CGLS) and the conjugate gradient solver with compressed sensing constraints (CG-CS).

Accordingly, a method is provided to perform a reconstruction of an image at a series of slice excitation locations, the method comprise, constructing an encoding matrix E, acquiring a signal vector s, and applying a reconstruction method selected from the group consisting of SIRT, CGLS, CG-CS, and a combination thereof.

In some embodiments, SIRT can also be used for computed tomography reconstruction where each observation in the measurement(s), and the corresponding row in the encoding matrix, produces an update to the image. In essence, projections from all rows are computed, and the image is successively updated concurrently. Moreover, a number of other measurements may be simultaneously updated.

Conjugate gradient methods may be explained with respect to steepest descent methods. Steepest descent methods typically start with an initialization of the solution, and iteratively converge by taking steps in directions that reduce the cost. This iterative convergence can proceed until it reaches a close enough solution, e.g., the image does not change sufficiently to require more iterations. However, steepest descent methods may take steps in previously traversed directions in the encoding matrix, which creates inefficiencies. This can be especially true for poorly conditioned system that have slow convergence.

By contrast, conjugate gradients methods typically relies on orthogonal search directions, proceeding one step in each direction until convergence. Conjugate gradient methods can be employed with additional regularization terms to be minimized simultaneously. The gradients can be estimated using, for example, derivatives of the combined cost function. Other options include use of a wavelet function, and a total variations term that measures the gradient variations in the image.

Optimization

The solvers discussed above can be especially slow due to the large size of the encoding matrix and low rank, making off-the-shelf tools impractical. For example, simply storing a matrix of size 300,000×200,000 in memory is an infeasible approach. In accordance with various embodiments therefore, the provided solvers can be advantageously optimized on a graphics processing unit (GPU) without the need for building the universal encoding matrix all at once, allowing for the possibility to solve very large linear systems such as those with greater than, for example, 500,000 rows and columns each.

One example of such an optimization regime is compute unified device architecture (CUDA®), the approach by Nvidia® to data parallel computing. This approach provides the ability to create hundreds of thousands of threads concurrently. These threads may also cooperate by sharing a shared memory section within a thread block. CUDA 'kernels' are blocks of code that execute for each thread. Depending on the thread's own ID, these kernels can execute different parts of the data. An example of this can be a vector addition for vectors of length 10,000. In this example, each of the 10,000 components can be added independently, and each of the components can constitute its own thread. The kernel in this instance can simply add corresponding scalar values at an index location between 1 and 10,000, depending on the index of the thread.

Kernels can be specified by choosing the number of threads per block and the number of blocks. Modification of these parameters can produce some differences in the level of optimization. The two common tasks for parallelization when solving the linear systems is to compute E times v, and $E^H$ times v, where E is the encoding matrix and v is any vector. Because the E matrix can be very large, this tool allows for dynamic computing by selecting the appropriate values for all the matrices (for example, the A-G matrices described above) by plugging them into the encoding matrix formulation.

Further, precomputed exponential maps are also used in lieu of calculating exponentials on the processing unit to speed up compute times.

Volume Interpolation

As discussed above, individual curvilinear slabs are reconstructed for individual slice excitations $\{m_{s1}, m_{s2}, \ldots, m_{sn}\}$, from which the final volume V can be constructed. These are individual curvilinear slabs reconstructed independently and then interpolated to a single 3D rectilinear volume. In the volume interpolation stage, these slabs may be overlapping, and thus can be reconstructed into a 3D volume. The volume interpolation steps take into account overlapping intensities from multiple slabs that may be jointly contributing to the intensity at a voxel. The steps to perform volume interpolation are discussed in detail below.

In accordance with various embodiments, a method is provided for performing volume interpolation. The method can comprise defining a volume V over which to reconstruct an image. The defining can be specified by a field of view and resolution in x, y and z directions (to span the bounds of the slabs). The method can further comprise, for each slab in $\{m_{s1}, m_{s2}, \ldots, m_{sn}\}$ and for each grid location over a plurality of grid locations (or all grid locations), finding the distance between a specified grid point and the closest (or adjacent) voxels on a 3D volume, and mapping an intensity (e.g., absolute value of the individual slice excitations) at the grid point and its distance to the neighboring voxels from one or more slabs within a specified proximity of the grid point. The mapping can occur such that grid point contains a list of intensities and corresponding distances mapped from all the slabs. The method can further comprise, for each voxel in the volume V, interpolating an intensity value from all intensities and corresponding distances assigned to the intensity. The interpolating can comprise performing an inverse distance weighting approach or a decaying exponential or gaussian weighting approach.

Figure 5:
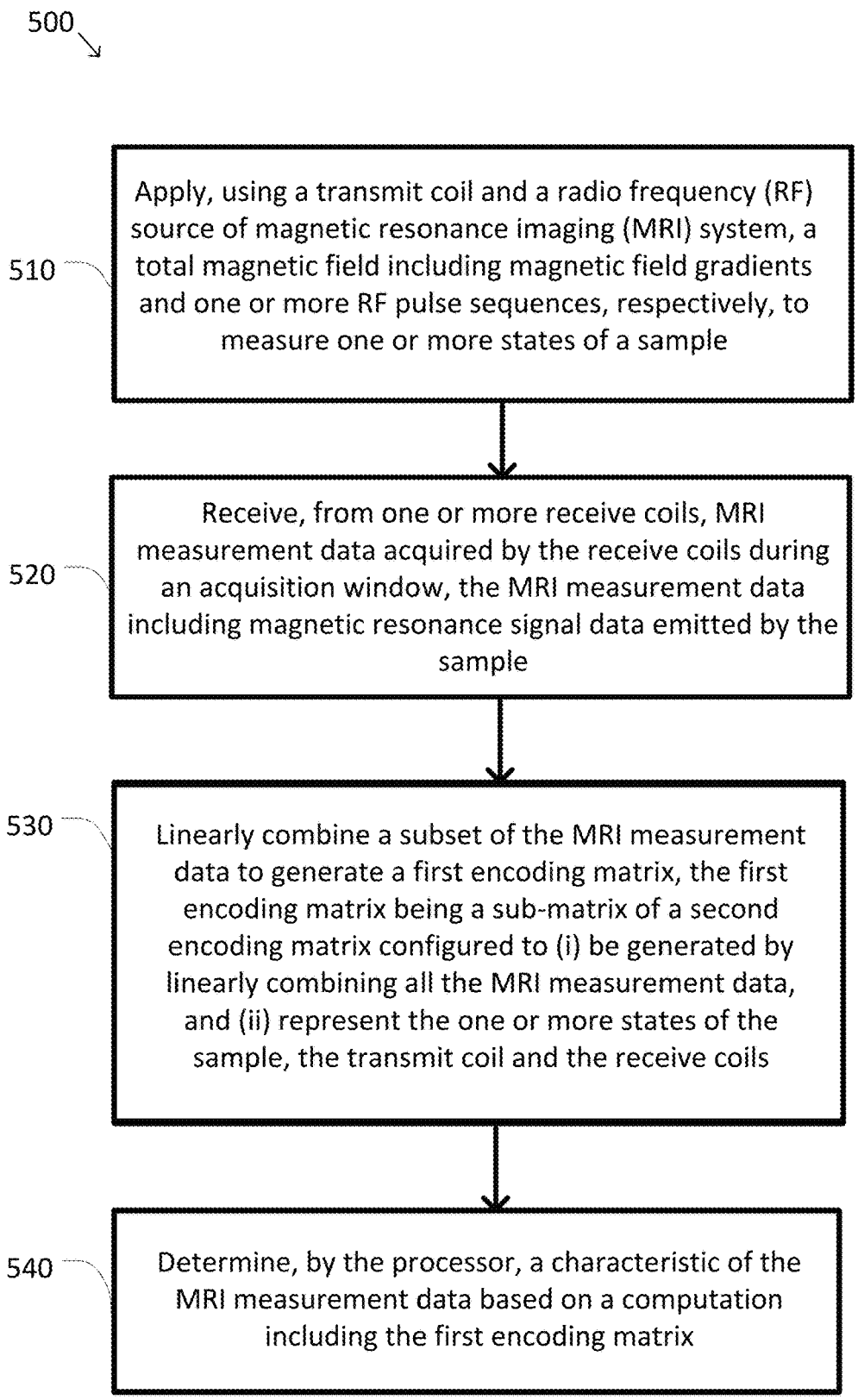
FIG. 5 shows an example flowchart illustrating a method for reconstructing magnetic resonance images based on magnetic resonance imaging signals, according to some embodiments of the present disclosure.

FIG. 5 shows an example flowchart illustrating a method for reconstructing magnetic resonance images based on magnetic resonance imaging signals, according to some embodiments of the present disclosure. At block 510, in some embodiments, a total magnetic field that includes magnetic field gradients and one or more RF pulse sequences may be applied to a sample or object of interest using a transmit coil and an RF source of an MRI system, respectively, to measure one or more states of the sample. That is, the sample or object of interest may be placed in an MRI system so that a magnetic resonance image of the sample or object of interest can be reconstructed based on the measurements of the MRI system. In some cases, the total magnetic field may include a main magnetic field $B_0$ that may not be uniform.

At block 520, receive coils of the MRI system may detect or acquire MRI measurements including magnetic resonance signals emitted by the sample or object of interest during an acquisition window or time period. In some embodiments, there may be multiple receive coils, each acquiring MRI measurements (e.g., independently). In some cases, the sensitivities of the receive coils can be different from the sensitivities of the transmit coils.

At block 530, in some embodiments, a linear system model may be used to linearly combine at least some of the measurements from the receive coils to generate an encoding matrix that can model or represent all or nearly all components in the MRI system including at least the magnetic field gradients, the main magnetic field $B_0$, the transmit and receive coil phase and amplitude sensitivities, the shape of the gradient profile, the readout-gradient and phase during measurement which may include phases induced by the x and y gradient in the presence of a permanent main field, etc. That is, a processor of a computing device (e.g., GPU) can linearly combine a subset of the MRI measurement data to generate a first encoding matrix, the first encoding matrix being a sub-matrix of a second encoding matrix configured to (i) be generated by linearly combining all the MRI measurement data, and (ii) represent the one or more states of the sample, the transmit coil and the receive coils. In some embodiments, the encoding matrix may include one or more encoding sub-matrices that encode or represent some of the all or nearly all components represented by the encoding matrix. For example, a sub-matrix may be generated by linearly combining some of the measurement data (e.g., but not all) and may encode some but not all components (e.g., readout-gradients and phase) of the MRI system.

At block 540, in some embodiments, a characteristic of the MRI measurement data may be determined based on a computation of the encoding sub-matrix. The characteristic may include one or more of the components such as phases acquired during the MRI measurement. In some embodiments, the subset of the MRI measurement data linearly combined to generate the encoding sub-matrix includes the MRI measurement data for a single magnetic field gradient of the magnetic field gradients and a single state of the one or more states of the sample; and the determined characteristic of the MRI measurement includes a shape of a readout gradient of the magnetic field gradients. In some embodiments, the subset of the MRI measurement data linearly combined to generate the encoding sub-matrix includes the MRI measurement data for a single receive coil of the receive coils or the transmit coil; and the determined characteristic of the MRI measurement includes a phase information of the sample during the measurement of the one or more states of the sample. In some embodiments, the subset of the MRI measurement data linearly combined to generate the first encoding sub-matrix includes the MRI measurement data related to amplitude and phase of the sample for a single receive coil of the receive coils or the transmit coil; and the determined characteristic of the MRI measurement includes an amplitude and phase sensitivity of the single receive coil or the transmit coil, respectively. In some embodiments, the characteristic of the MRI measurement data is determined without generating the second encoding matrix.

In some embodiments, the method further comprises reconstructing, via the processor, a magnetic resonance image of the sample based on the determined characteristic of the MRI measurement. In some embodiments, the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MRI measurement. In some embodiments, the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil or the transmit coil, respectively.

In some embodiments, the amplitude and phase sensitivity of the single receive coil are different from the amplitude and phase sensitivity of the transmit coil. In some embodiments, the magnetic field gradients are non-linear magnetic field gradients. In some embodiments, the total magnetic field includes a non-uniform static magnetic field.

Computer Implemented System

In various embodiments, the methods for reconstructing magnetic resonance images from magnetic resonance imaging signals can be implemented via computer software or hardware. That is, the methods (e.g., 500 in FIG. 5) disclosed herein can be implemented on a computing device that includes a processor and an engine that receive input and generate output. In various embodiments, the computing device can be communicatively connected to a data store or memory and a display device via a direct connection or through an internet connection.

Figure 6:
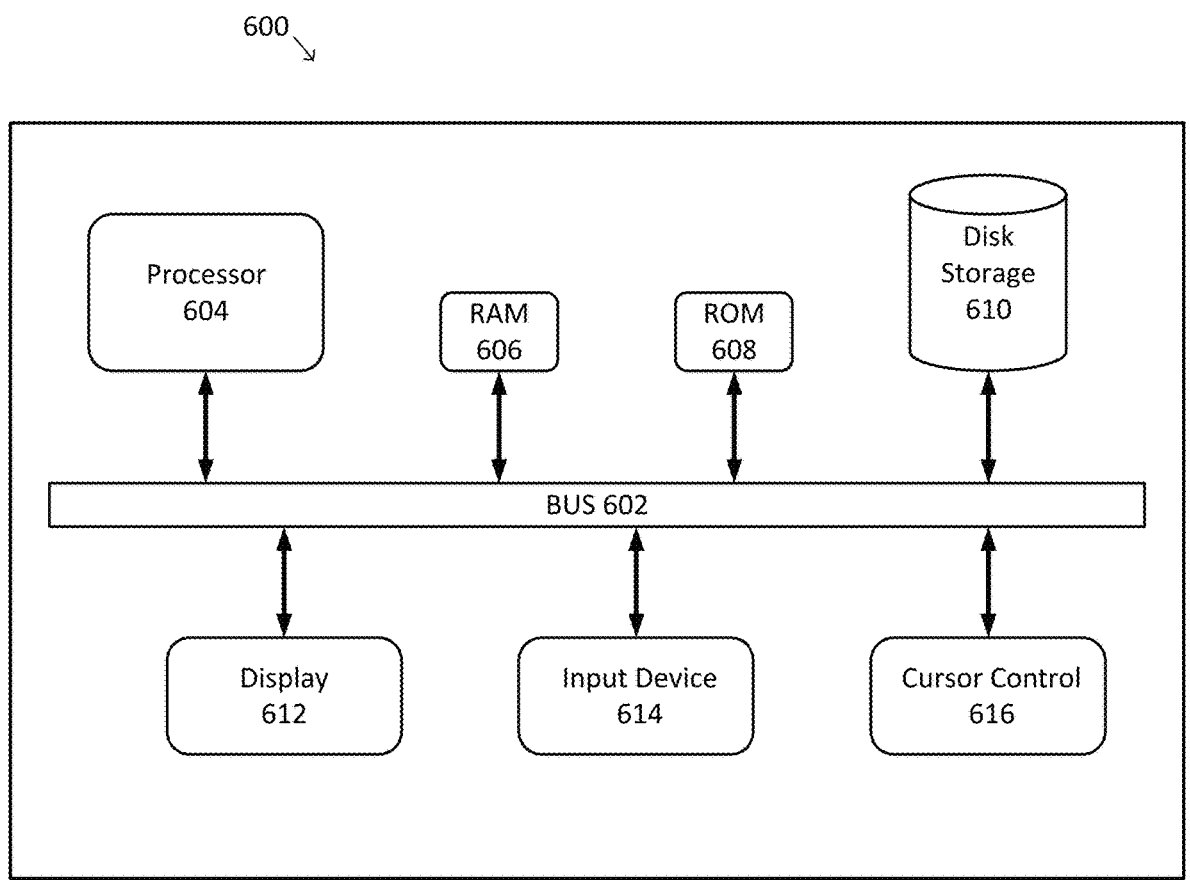
FIG. 6 is a block diagram illustrating a computer system upon which embodiments of the present teachings may be implemented.

FIG. 6 is a block diagram illustrating a computer system 600 upon which embodiments of the present teachings may be implemented. In various embodiments of the present teachings, computer system 600 can include a bus 602 or other communication mechanism for communicating information and a processor 604 coupled with bus 602 for processing information. In various embodiments, computer system 600 can also include a memory, which can be a random-access memory (RAM) 606 or other dynamic storage device, coupled to bus 602 for determining instructions to be executed by processor 604. Memory can also be used for storing temporary variables or other intermediate information during execution of instructions to be executed by processor 604. In various embodiments, computer system 600 can further include a read only memory (ROM) 608 or other static storage device coupled to bus 602 for storing static information and instructions for processor 604. A storage device 610, such as a magnetic disk or optical disk, can be provided and coupled to bus 602 for storing information and instructions. In some embodiments, the computer system can be a graphics processing unit (GPU).

In various embodiments, computer system 600 can be coupled via bus 602 to a display 612, such as a cathode ray tube (CRT) or liquid crystal display (LCD), for displaying information to a computer user. An input device 614, including alphanumeric and other keys, can be coupled to bus 602 for communication of information and command selections to processor 604. Another type of user input device is a cursor control 616, such as a mouse, a trackball or cursor direction keys for communicating direction information and command selections to processor 604 and for controlling cursor movement on display 612. This input device 614 typically has two degrees of freedom in two axes, a first axis (i.e., x) and a second axis (i.e., y), that allows the device to specify positions in a plane. However, it should be understood that input devices 614 allowing for 3-dimensional (x, y and z) cursor movement are also contemplated herein.

Consistent with certain implementations of the present teachings, results can be provided by computer system 600 in response to processor 604 executing one or more sequences of one or more instructions contained in memory 606. Such instructions can be read into memory 606 from another computer-readable medium or computer-readable storage medium, such as storage device 610. Execution of the sequences of instructions contained in memory 606 can cause processor 604 to perform the processes described herein. Alternatively, hard-wired circuitry can be used in place of or in combination with software instructions to implement the present teachings. Thus, implementations of the present teachings are not limited to any specific combination of hardware circuitry and software.

The term "computer-readable medium" (e.g., data store, data storage, etc.) or "computer-readable storage medium" as used herein refers to any media that participates in providing instructions to processor 604 for execution. Such a medium can take many forms, including but not limited to, non-volatile media, volatile media, and transmission media. Examples of non-volatile media can include, but are not limited to, dynamic memory, such as memory 606. Examples of transmission media can include, but are not limited to, coaxial cables, copper wire, and fiber optics, including the wires that comprise bus 602.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, PROM, and EPROM, a FLASH-EPROM, another memory chip or cartridge, or any other tangible medium from which a computer can read.

In addition to computer-readable medium, instructions or data can be provided as signals on transmission media included in a communications apparatus or system to provide sequences of one or more instructions to processor 604 of computer system 600 for execution. For example, a communication apparatus may include a transceiver having signals indicative of instructions and data. The instructions and data are configured to cause one or more processors to implement the functions outlined in the disclosure herein. Representative examples of data communications transmission connections can include, but are not limited to, telephone modem connections, wide area networks (WAN), local area networks (LAN), infrared data connections, NFC connections, etc.

It should be appreciated that the methodologies described herein, flow charts, diagrams and accompanying disclosure can be implemented using computer system 600 as a stand-alone device or on a distributed network or shared computer processing resources such as a cloud computing network.

The methodologies described herein may be implemented by various means depending upon the application. For example, these methodologies may be implemented in hardware, firmware, software, or any combination thereof. For a hardware implementation, the processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

In various embodiments, the methods of the present teachings may be implemented as firmware and/or a software program and applications written in conventional programming languages such as C, C++, Python, etc. If implemented as firmware and/or software, the embodiments described herein can be implemented on a non-transitory computer-readable medium in which a program is stored for causing a computer to perform the methods described above. It should be understood that the various engines described herein can be provided on a computer system, such as computer system 600, whereby processor 604 would execute the analyses and determinations provided by these engines, subject to instructions provided by any one of, or a combination of, memory components 606/608/610 and user input provided via input device 614.

Figure 7:
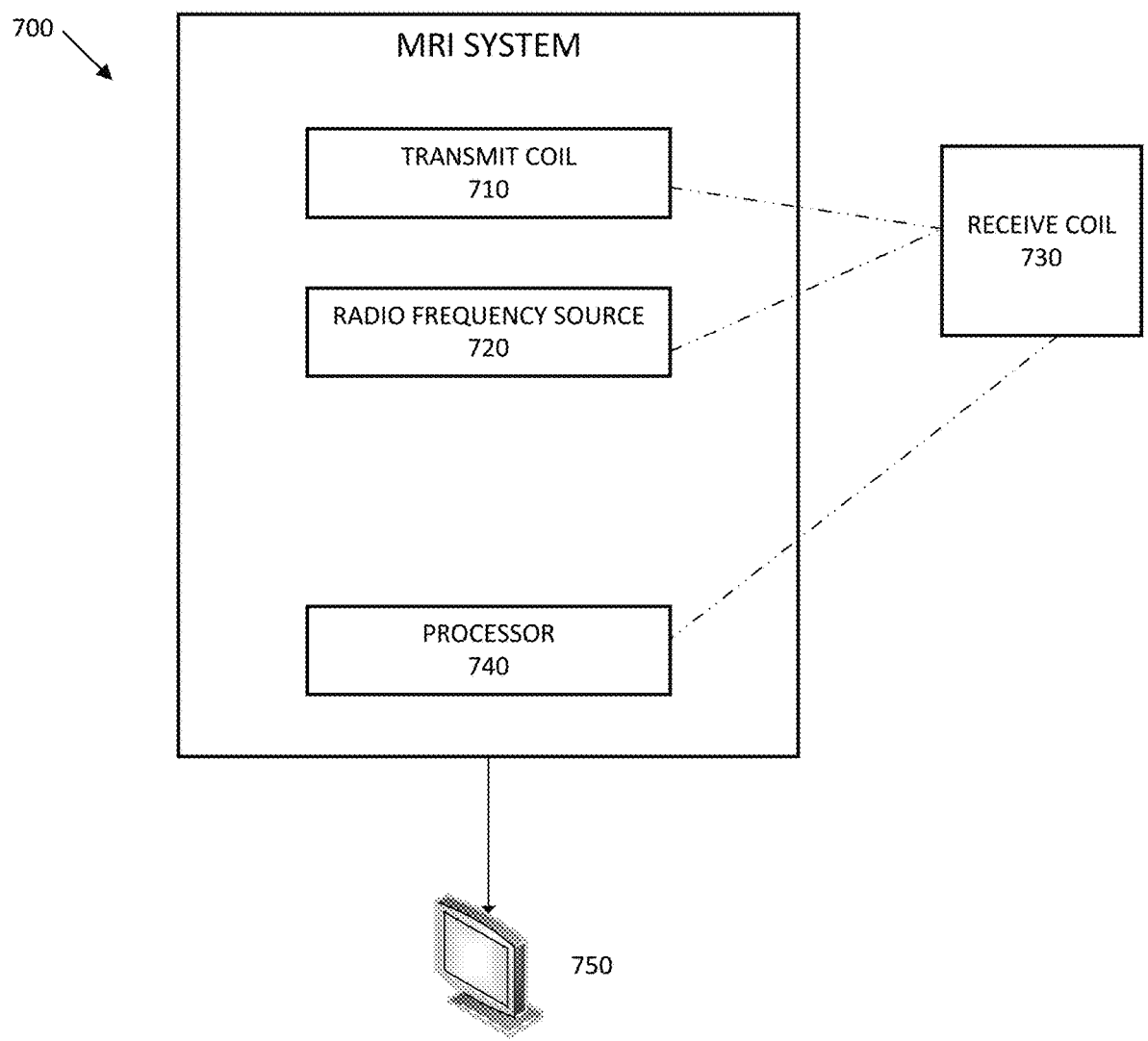
FIG. 7 shows an example block diagram illustrating a system for reconstructing magnetic resonance images based on magnetic resonance imaging signals, according to some embodiments of the present disclosure.

FIG. 7 shows an example block diagram illustrating a MRI system 700 for reconstructing magnetic resonance images based on magnetic resonance imaging signals, according to some embodiments of the present disclosure. In some embodiments, the MRI system 700 may include a transmit coil 710, a radio frequency source 720, a receive coil 730 and a processor 740. In some embodiments, the MRI system 700 may be coupled to or in communication to a computing device 750 configured to receive output from MRI system 700 for further analysis, presentation, etc. In some embodiments, the processor 740 may be part of the computing device 750 or the computing device 750 may be a component of the MRI system 700.

In some embodiments, the transmit coil and the radio frequency (RF) source may be configured to apply a total magnetic field including magnetic field gradients and one or more RF pulse sequences, respectively, to measure one or more states of a sample. Further, in some embodiments, the one or more receive coils may be configured to acquire MRI measurement data including magnetic resonance signal data emitted by the sample during an acquisition window. In addition, in some embodiments, the processor configured to receive, from the one or more receive coils, the MRI measurement data. Further, the processor may be configured to linearly combine a subset of the MRI measurement data to generate a first encoding matrix, the first encoding matrix being a sub-matrix of a second encoding matrix configured to (i) be generated by linearly combining all the MRI measurement data, and (ii) represent the one or more states of the sample, the transmit coil and the receive coils. In addition, the processor may be configured to determine a characteristic of the MRI measurement data based on a computation of the first encoding matrix. In some embodiments, the processor may be further configured to reconstruct a magnetic resonance image of the sample based on the determined characteristic of the MRI measurement.

While the present teachings are described in conjunction with various embodiments, it is not intended that the present teachings be limited to such embodiments. On the contrary, the present teachings encompass various alternatives, modifications, and equivalents, as will be appreciated by those of skill in the art.

In describing the various embodiments, the specification may have presented a method and/or process as a particular sequence of steps. However, to the extent that the method or process does not rely on the particular order of steps set forth herein, the method or process should not be limited to the particular sequence of steps described, and one skilled in the art can readily appreciate that the sequences may be varied and still remain within the spirit and scope of the various embodiments.

Although illustrative embodiments have been shown and described, a wide range of modification, change and substitution is contemplated in the foregoing disclosure and in some instances, some features of the embodiments may be employed without a corresponding use of other features. One of ordinary skill in the art would recognize many variations, alternatives, and modifications. Thus, the scope of the invention should be limited only by the following claims, and it is appropriate that the claims be construed broadly and in a manner consistent with the scope of the embodiments disclosed herein.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Recitation of Embodiments

Embodiment 1. A method of magnetic resonance imaging (MRI), comprising: applying, using a transmit coil and a radio frequency (RF) source, a total magnetic field including magnetic field gradients and one or more RF pulse sequences, respectively, to measure one or more states of a sample; receiving, from one or more receive coils, MRI measurement data acquired by the receive coils during an acquisition window, the MRI measurement data including magnetic resonance signal data emitted by the sample; linearly combining, via a processor, a subset of the MRI measurement data to generate a first encoding matrix, the first encoding matrix being a sub-matrix of a second encoding matrix configured to (i) be generated by linearly combining all the MRI measurement data, and (ii) represent the one or more states of the sample, the transmit coil and the receive coils and; and determining, by the processor, a characteristic of the MRI measurement data based on a computation of the first encoding matrix.

Embodiment 2. The method of Embodiment 1, wherein: the subset of the MRI measurement data linearly combined to generate the first encoding matrix includes the MRI measurement data for a single magnetic field gradient of the magnetic field gradients and a single state of the one or more states of the sample; and the determined characteristic of the MRI measurement includes a shape of a readout gradient of the magnetic field gradients.

Embodiment 3. The method of Embodiments 1 or 2, wherein: the subset of the MRI measurement data linearly combined to generate the first encoding matrix includes the MRI measurement data for a single receive coil of the receive coils or the transmit coil; and the determined characteristic of the MRI measurement includes a phase information of the sample during the measurement of the one or more states of the sample.

Embodiment 4. The method of any one of Embodiments 1 to 3, wherein: the subset of the MRI measurement data linearly combined to generate the first encoding matrix includes the MRI measurement data related to amplitude and phase of the sample for a single receive coil of the receive coils or the transmit coil; and the determined characteristic of the MRI measurement includes an amplitude and phase sensitivity of the single receive coil or the transmit coil, respectively.

Embodiment 5. The method of Embodiment 4, wherein the amplitude and phase sensitivity of the single receive coil are different from the amplitude and phase sensitivity of the transmit coil.

Embodiment 6. The method of any one of Embodiments 1 to 5, wherein the magnetic field gradients are non-linear magnetic field gradients.

Embodiment 7. The method of any one of Embodiments 1 to 6, wherein the total magnetic field includes a non-uniform static magnetic field.

Embodiment 8. The method of any one of Embodiments 1 to 7, further comprising reconstructing, via the processor, a magnetic resonance image of the sample based on the determined characteristic of the MRI measurement.

Embodiment 9. The method of Embodiment 8, wherein the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MRI measurement.

Embodiment 10. The method of any one of Embodiments 1 to 9, wherein the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil or the transmit coil, respectively.

Embodiment 11. The method of any one of Embodiments 1 to 10, wherein the characteristic of the MRI measurement data is determined without generating the second encoding matrix.

Embodiment 12. A magnetic resonance imaging (MRI) system, comprising: a transmit coil and a radio frequency (RF) source configured to apply a total magnetic field including magnetic field gradients and one or more RF pulse sequences, respectively, to measure one or more states of a sample; one or more receive coils configured to acquire MRI measurement data including magnetic resonance signal data emitted by the sample during an acquisition window; and a processor configured to: receive, from the one or more receive coils, the MRI measurement data; linearly combine a subset of the MRI measurement data to generate a first encoding matrix, the first encoding matrix being a submatrix of a second encoding matrix configured to (i) be generated by linearly combining all the MRI measurement data, and (ii) represent the one or more states of the sample, the transmit coil and the receive coils and; determine a characteristic of the MRI measurement data based on a computation of the first encoding matrix.

Embodiment 13. The system of Embodiment 12, wherein the subset of the MRI measurement data linearly combined to generate the first encoding matrix includes the MRI measurement data for a single magnetic field gradient of the magnetic field gradients and a single state of the one or more states of the sample; and the determined characteristic of the MRI measurement includes a shape of a readout gradient of the magnetic field gradients.

Embodiment 14. The system of Embodiments 12 or 13, wherein the subset of the MRI measurement data linearly combined to generate the first encoding matrix includes the MRI measurement data for a single receive coil of the receive coils or the transmit coil; and the determined characteristic of the MRI measurement includes a phase information of the sample during the measurement of the one or more states of the sample.

Embodiment 15. The system of any one of Embodiments 12 to 14, wherein the subset of the MRI measurement data linearly combined to generate the first encoding matrix includes the MRI measurement data related to amplitude and phase of the sample for a single receive coil of the receive coils or the transmit coil; and the determined characteristic of the MRI measurement includes an amplitude and phase sensitivity of the single receive coil or the transmit coil, respectively.

Embodiment 16. The system of Embodiment 15, wherein the amplitude and phase sensitivity of the single receive coil are different from the amplitude and phase sensitivity of the transmit coil.

Embodiment 17. The system of any one of Embodiments 12 to 16, wherein the magnetic field gradients are non-linear magnetic field gradients.

Embodiment 18. The system of any one of Embodiments 12 to 17, wherein the total magnetic field includes a non-uniform static magnetic field.

Embodiment 19. The system of any one of Embodiments 12 to 18, wherein the processor is further configured to reconstruct a magnetic resonance image of the sample based on the determined characteristic of the MRI measurement.

Embodiment 20. The system of Embodiment 19, wherein the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MRI measurement.

Embodiment 21. The system of claim any one of Embodiments 12 to 20, wherein the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil or the transmit coil, respectively.

Embodiment 22. The system of any one Embodiments 12 to 21, wherein the characteristic of the MRI measurement data is determined without generating the second encoding matrix.

What is claimed is:
1. A method of magnetic resonance imaging (MM), comprising:
applying, using a transmit coil and a radio frequency (RF) source, a total magnetic field including magnetic field gradients and one or more RF pulse sequences, respectively, to measure one or more states of a sample;

receiving, from one or more receive coils, MRI measurement data acquired by the receive coils during an acquisition window, the MM measurement data including magnetic resonance signal data emitted by the sample;

linearly combining, via a processor, a subset of the MRI measurement data to generate a first encoding matrix, the first encoding matrix being a sub-matrix of a second encoding matrix configured to (i) be generated by linearly combining all the MRI measurement data, and (ii) represent the one or more states of the sample, the transmit coil and the receive coils, wherein the subset of the MRI measurement data linearly combined to generate the first encoding matrix includes the MRI measurement data for a single magnetic field gradient of the magnetic field gradients and a single state of the one or more states of the sample; and determining, by the processor, a characteristic of the MM measurement data based on a computation of the first encoding matrix, wherein the determined characteristic of the MRI measurement includes a shape of a readout gradient of the magnetic field gradients.

2. The method of claim 1, wherein:
the subset of the MRI measurement data linearly combined to generate the first encoding matrix further includes the MM measurement data for a single receive coil of the receive coils or the transmit coil; and
the determined characteristic of the MRI measurement further includes a phase information of the sample during the measurement of the one or more states of the sample.

3. The method of claim 1, wherein the magnetic field gradients are non-linear magnetic field gradients.

4. The method of claim 1, wherein the total magnetic field includes a non-uniform static magnetic field.

5. The method of claim 1, further comprising reconstructing, via the processor, a magnetic resonance image of the sample based on the determined characteristic of the MRI measurement.

6. The method of claim 5, wherein the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MRI measurement.

7. The method of claim 1, wherein the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil of the receive coils or the transmit coil, respectively.

8. A magnetic resonance imaging (MRI) system, comprising:
a transmit coil and a radio frequency (RF) source configured to apply a total magnetic field including magnetic field gradients and one or more RF pulse sequences, respectively, to measure one or more states of a sample;
one or more receive coils configured to acquire MRI measurement data including magnetic resonance signal data emitted by the sample during an acquisition window; and a processor configured to:
receive, from the one or more receive coils, the MRI measurement data;
linearly combine a subset of the MRI measurement data to generate a first encoding matrix, the first encoding matrix being a sub-matrix of a second encoding matrix configured to (i) be generated by linearly combining all the MM measurement data, and (ii) represent the one or more states of the sample, the transmit coil and the receive coils, wherein the subset of the MM measurement data linearly combined to generate the first encoding matrix includes the MM measurement data for a single magnetic field gradient of the magnetic field gradients and a single state of the one or more states of the sample;
determine a characteristic of the MM measurement data based on a computation of the first encoding matrix, wherein the determined characteristic of the MRI measurement includes a shape of a readout gradient of the magnetic field gradients.

9. The system of claim 8, wherein:
the subset of the MRI measurement data linearly combined to generate the first encoding matrix further includes the MM measurement data for a single receive coil of the receive coils or the transmit coil; and
the determined characteristic of the MRI measurement further includes a phase information of the sample during the measurement of the one or more states of the sample.

10. The system of claim 8, wherein the magnetic field gradients are non-linear magnetic field gradients.

11. The system of claim 8, wherein the total magnetic field includes a non-uniform static magnetic field.

12. The system of claim 8, wherein the processor is further configured to reconstruct a magnetic resonance image of the sample based on the determined characteristic of the MRI measurement.

13. The system of claim 12, wherein the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MRI measurement.

14. The system of claim 8, wherein the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil of the receive coils or the transmit coil, respectively.

15. A method of magnetic resonance imaging (MRI), comprising:
applying, using a transmit coil and a radio frequency (RF) source, a total magnetic field including magnetic field gradients and one or more RF pulse sequences, respectively, to measure one or more states of a sample;
receiving, from one or more receive coils, MRI measurement data acquired by the receive coils during an acquisition window, the MM measurement data including magnetic resonance signal data emitted by the sample;
linearly combining, via a processor, a subset of the MRI measurement data to generate a first encoding matrix, the first encoding matrix being a sub-matrix of a second encoding matrix configured to (i) be generated by linearly combining all the MRI measurement data, and (ii) represent the one or more states of the sample, the transmit coil and the receive coils, wherein the subset of the MRI measurement data linearly combined to generate the first encoding matrix includes the MRI measurement data related to amplitude and phase of the sample for a single receive coil of the receive coils or the transmit coil; and determining, by the processor, a characteristic of the MRI measurement data based on a computation of the first encoding matrix, wherein the determined characteristic of the MRI measurement includes an amplitude and phase sensitivity of the single receive coil of the receive coils or the transmit coil, respectively.

16. The method of claim 15, wherein the amplitude and phase sensitivity of the single receive coil of the receive coils are different from the amplitude and phase sensitivity of the transmit coil.

17. The method of claim 15, wherein:
the subset of the MRI measurement data linearly combined to generate the first encoding matrix further includes the MRI measurement data for a single receive coil of the receive coils or the transmit coil; and
the determined characteristic of the MRI measurement further includes a phase information of the sample during the measurement of the one or more states of the sample.

18. The method of claim 15, wherein the magnetic field gradients are non-linear magnetic field gradients.

19. The method of claim 15, wherein the total magnetic field includes a non-uniform static magnetic field.

20. The method of claim 15, further comprising reconstructing, via the processor, a magnetic resonance image of the sample based on the determined characteristic of the MRI measurement.

21. The method of claim 20, wherein the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MRI measurement.

22. The method of claim 15, wherein the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil of the receive coils or the transmit coil, respectively.

23. A method of magnetic resonance imaging (MRI), comprising:
applying, using a transmit coil and a radio frequency (RF) source, a total magnetic field including magnetic field gradients and one or more RF pulse sequences, respectively, to measure one or more states of a sample;
receiving, from one or more receive coils, MRI measurement data acquired by the receive coils during an acquisition window, the MRI measurement data including magnetic resonance signal data emitted by the sample;
linearly combining, via a processor, a subset of the MRI measurement data to generate a first encoding matrix, the first encoding matrix being a sub-matrix of a second encoding matrix configured to (i) be generated by linearly combining all the MRI measurement data, and (ii) represent the one or more states of the sample, the transmit coil and the receive coils and; and determining, by the processor, a characteristic of the MRI measurement data based on a computation of the first encoding matrix, wherein the characteristic of the MRI measurement data is determined without generating the second encoding matrix.

24. The method of claim 23, wherein:
the subset of the MRI measurement data linearly combined to generate the first encoding matrix further includes the MRI measurement data for a single receive coil of the receive coils or the transmit coil; and
the determined characteristic of the MRI measurement further includes a phase information of the sample during the measurement of the one or more states of the sample.

25. The method of claim 23, wherein the magnetic field gradients are non-linear magnetic field gradients.

26. The method of claim 23, wherein the total magnetic field includes a non-uniform static magnetic field.

27. The method of claim 23, further comprising reconstructing, via the processor, a magnetic resonance image of the sample based on the determined characteristic of the MRI measurement.

28. The method of claim 27, wherein the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MRI measurement.

29. The method of claim 23, wherein the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil of the receive coils or the transmit coil, respectively.

30. A magnetic resonance imaging (MRI) system, comprising:
a transmit coil and a radio frequency (RF) source configured to apply a total magnetic field including magnetic field gradients and one or more RF pulse sequences, respectively, to measure one or more states of a sample;
one or more receive coils configured to acquire MRI measurement data including magnetic resonance signal data emitted by the sample during an acquisition window; and
a processor configured to:
receive, from the one or more receive coils, the MRI measurement data;
linearly combine a subset of the MRI measurement data to generate a first encoding matrix, the first encoding matrix being a sub-matrix of a second encoding matrix configured to (i) be generated by linearly combining all the MRI measurement data, and (ii) represent the one or more states of the sample, the transmit coil and the receive coils, wherein the subset of the MRI measurement data linearly combined to generate the first encoding matrix includes the MRI measurement data related to amplitude and phase of the sample for a single receive coil of the receive coils or the transmit coil;
determine a characteristic of the MRI measurement data based on a computation of the first encoding matrix, wherein the determined characteristic of the MRI measurement includes an amplitude and phase sensitivity of the single receive coil of the receive coils or the transmit coil, respectively.

31. The system of claim 30, wherein the amplitude and phase sensitivity of the single receive coil of the receive coils are different from the amplitude and phase sensitivity of the transmit coil.

32. The system of claim 30, wherein:
the subset of the MRI measurement data linearly combined to generate the first encoding matrix further includes the MM measurement data for a single receive coil of the receive coils or the transmit coil; and
the determined characteristic of the MRI measurement further includes a phase information of the sample during the measurement of the one or more states of the sample.

33. The system of claim 30, wherein the magnetic field gradients are non-linear magnetic field gradients.

34. The system of claim 30, wherein the total magnetic field includes a non-uniform static magnetic field.

35. The system of claim 30, wherein the processor is further configured to reconstruct a magnetic resonance image of the sample based on the determined characteristic of the MRI measurement.

36. The system of claim 35, wherein the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MRI measurement.

37. The system of claim 30, wherein the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil of the receive coils or the transmit coil, respectively.

38. A magnetic resonance imaging (MM) system, comprising:
a transmit coil and a radio frequency (RF) source configured to apply a total magnetic field including magnetic field gradients and one or more RF pulse sequences, respectively, to measure one or more states of a sample;
one or more receive coils configured to acquire MRI measurement data including magnetic resonance signal data emitted by the sample during an acquisition window; and
a processor configured to:
receive, from the one or more receive coils, the MM measurement data;
linearly combine a subset of the MRI measurement data to generate a first encoding matrix, the first encoding matrix being a sub-matrix of a second encoding matrix configured to (i) be generated by linearly combining all the MM measurement data, and (ii) represent the one or more states of the sample, the transmit coil and the receive coils and;
determine a characteristic of the MM measurement data based on a computation of the first encoding matrix, wherein the characteristic of the MM measurement data is determined without generating the second encoding matrix.

39. The system of claim 38, wherein:
the subset of the MRI measurement data linearly combined to generate the first encoding matrix further includes the MM measurement data for a single receive coil of the receive coils or the transmit coil; and
the determined characteristic of the MRI measurement further includes a phase information of the sample during the measurement of the one or more states of the sample.

40. The system of claim 38, wherein the magnetic field gradients are non-linear magnetic field gradients.

41. The system of claim 38, wherein the total magnetic field includes a non-uniform static magnetic field.

42. The system of claim 38, wherein the processor is further configured to reconstruct a magnetic resonance image of the sample based on the determined characteristic of the MRI measurement.

43. The system of claim 42, wherein the reconstructing the magnetic resonance image includes applying one or more of a simultaneous iterative reconstruction technique (SIRT), a conjugate gradients least squares (CGLS) method or a conjugate gradient solver with compressed sensing constraints (CG-CS) to at least the determined characteristic of the MM measurement.

44. The system of claim 38, wherein the determined characteristic of the MRI measurement is selected from the group consisting of a shape of a readout gradient of the magnetic field gradients, a phase information of the sample during the measurement of the one or more states of the sample, and an amplitude and phase sensitivity of the single receive coil of the receive coils or the transmit coil, respectively.

* * * * *